United States Patent [19]

Young

[11] Patent Number: 4,560,949

[45] Date of Patent: Dec. 24, 1985

[54] HIGH SPEED AGC CIRCUIT

[75] Inventor: James P. Young, Cedar Rapids, Iowa

[73] Assignee: Rockwell International Corporation, El Segundo, Calif.

[21] Appl. No.: 423,762

[22] Filed: Sep. 27, 1982

[51] Int. Cl.⁴ .............................................. H03G 3/20
[52] U.S. Cl. ................................... 330/284; 330/110; 330/279
[58] Field of Search ................. 330/129, 135, 85, 278, 330/279, 284, 294, 110, 282, 145

[56] References Cited

U.S. PATENT DOCUMENTS

| | | | |
|---|---|---|---|
| 3,613,011 | 10/1971 | Wood | 330/110 |
| 3,671,886 | 6/1972 | Fudemoto et al. | 330/145 |
| 4,114,105 | 9/1978 | Duncan | 330/282 |
| 4,204,172 | 5/1980 | Ben Sadou et al. | 330/138 |
| 4,429,285 | 1/1984 | Bradshaw | 330/294 |

FOREIGN PATENT DOCUMENTS 0117659  9/1979  Japan ................................... 330/282

OTHER PUBLICATIONS

Matthew Mandl, Directory of Electronic Circuits Chapter 12, "Reactance Circuits" pp. 211–212, Prentice-Hall 1978.

Primary Examiner—James B. Mullins
Assistant Examiner—G. Wan
Attorney, Agent, or Firm—George A. Montanye; H. Fredrick Hamann

[57] ABSTRACT

An automatic gain control circuit is disclosed which enables the control of feedback gain to stabilize the circuit and increase its speed of operation. The AGC circuit includes an operational amplifier having a varactor diode coupled between one input and an output. The circuit is used to provide a feedback control signal in response to an optical signal such that the varactor diode reduces loop gain when the output signal would otherwise cause an increase in gain and drive the feedback loop to instability, and increases loop gain when the output signal would otherwise cause a decrease in loop gain and lower response time.

11 Claims, 8 Drawing Figures

HIGH SPEED AGC CIRCUIT

BACKGROUND OF THE INVENTION

The present invention relates to non-linear control loop circuits and more particularly to a high speed automatic gain control loop for attenuation control.

Automatic gain control circuits (AGC) are well known in the prior art and are generally used to maintain a predetermined signal level at an output in spite of variations in the signal level at an input. Such circuits are used in a wide variety of electronic devices including radio and television receivers and other communication systems. One example of an automatic gain control circuit includes the use of an attenuator in an automatic gain controlled IF amplifier portion of a signal receiving circuit. In such systems, the attenuator operates to provide a relatively constant radio frequency (RF) signal output for a varying RF signal input by inserting or removing an impedance between the RF input and RF output.

In the above prior-known systems, most RF attenuators have an attenuation versus control signal (voltage or current) characteristic which is non-linear. This means that the voltage or current used to control the magnitude of attenuation is not linearly related to the magnitude of attenuation achieved. This is particularly true for PIN diode attenuators and other similarly constructed attenuators. Typically, PIN diode attenuators may be controlled by sensing the output of the attenuator with a conventional detector circuit, integrating the detected output, and driving a control line on the attenuator to increase or decrease the attenuation in response to the RF output.

When using attenuators or other control circuits having non-linear control signal versus output characteristics, the detected RF output signal normally causes a high gain in the feedback loop in the high attenuation region of operation and a low gain in the low attenuation region of operation. Since it is known that high loop gain enables a faster control response, ano since fast response is often desired in the electronic circuits involved, it is necessary to fix loop gain as high as possible while still providing loop stability. However, when prior art AGC circuits are constructed to be stable in the high attenuation regions, then the loop gain will decrease and respond slowly in the low attenuation region due to the non-linear relationship between the control signal and attenuation produced. Conversely, if the feedback loop gain is increased to speed up loop operation in the low attenuation region, then in the high attenuation region, the loop will be driven to an unstable condition, again as a result of the non-linear relationship between the control signal and attenuation produced.

In view of the above problems, attempts have been made to reduce the non-linear relationship between the control signal and attenuation response. In order to accomplish this, many prior art solutions have proposed the use of a linearizing circuit placed between the integrator and the control line of the attenuator. The linearizer essentially acts as a driver circuit which responds to the detected RF output so that the control signal achieves a linear relationship with attenuation over the range of operation of the attenuator. One of the disadvantages of this technique, however is the resulting complexity of the linearizer which is more expensive, requires more elements, is increased in size, has a higher repair rate and expends more power. In high technology electronic systems, such characteristics are unacceptable, particularly where there is great emphasis to reduce size, weight, repair rate, power requirements and expense of state-of-the-art devices.

Accordingly, the present invention has been developed to overcome the specific shortcomings of the above known and similar techniques and to provide an automatic gain control circuit which will provide greater stability and improved response time over its range of operation.

SUMMARY OF THE INVENTION

In accordance with the present invention, an automatic gain control circuit is constructed using a detector and operational amplifier integrator for providing a feedback control signal which is used to maintain a substantially constant output signal for a varying input signal. The AGC circuit includes an operational amplifier having a varactor diode coupled between one of its inputs and its output for controlling loop gain. In one embodiment, using an attenuator coupled to control the RF signal to an IF amplifier, the RF output from the attenuator is coupled to a detector and thence to one input of the operational amplifier. The output of the operational amplifier is then coupled to the control line of the attenuator to complete a feedback loop. The attenuator has a non-linear relationship between the control signal required to produce attenuation and the magnitude of attenuation produced. As the gain of the feedback loop increases in response to the detected RF output in the high attenuation region of operation, the capacitance of the varactor diode increases, reducing the loop gain and maintaining feedback loop stability. Alternatively, as the feedback loop gain decreases in response to the detected RF output in the low attenuation region of operation, the capacitor of the varactor diode decreases, increasing the feedback loop gain and increasing the response time of the AGC circuit.

It is therefore a feature of the invention to provide an electronic device for use in an automatic gain control circuit for increasing circuit response time and improving circuit stability.

It is another feature of the invention to provide an automatic gain control circuit with improved response time and circuit stability.

It is a further feature of the invention to provide a linear loop gain control circuit for controlling electronic devices having an output which is not linearly related to a signal controlling that output.

A further feature of the invention is to provide an automatic gain control circuit for use with an attenuator having a non-linear relationship between its control signal and the attenuation proouced by that control signal.

Still another feature of the invention is to provide an automatic gain control circuit which includes an operational amplifier shunted by a varactor diode for increasing loop gain and response time in one control region and decreasing loop gain in another control region.

These and other advantages and novel features of the invention will become apparent from the following detailed description when considered with the accompanying drawings wherein:

DETAILED DESCRIPTION OF A PREFERRED EMBODIMENT

Figure 1:
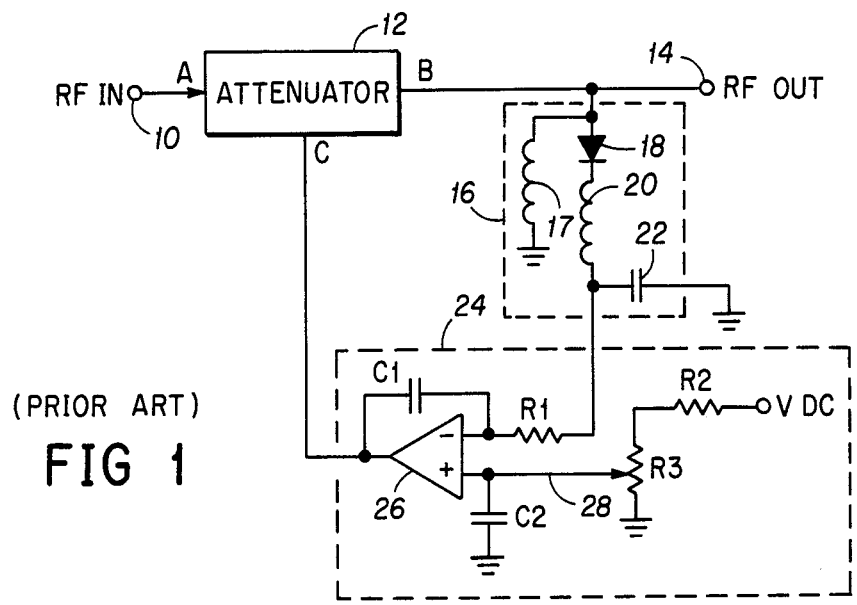
FIG. 1 is a schematic diagram showing a prior art automatic gain control circuit.

Referring first to FIG. 1, there is shown a prior art automatic gain control circuit which may be used to maintain a relatively constant magnitude RF signal to, for example, an IF amplifier in spite of wide variations in an RF input signal. In this instance, an RF input signal is received at terminal 10 and coupled to terminal A of attenuator 12. The attenuator 12 includes an output terminal B which provides an attenuated RF output at terminal 14 for coupling to a conventional IF amplifier. The attenuation at terminal B is controlled by a control signal input to terminal C of attenuator 12 in a conventional manner, and typically is such that the attenuation produced at terminal B is not linearly related to the control signal at C.

Figure 2:
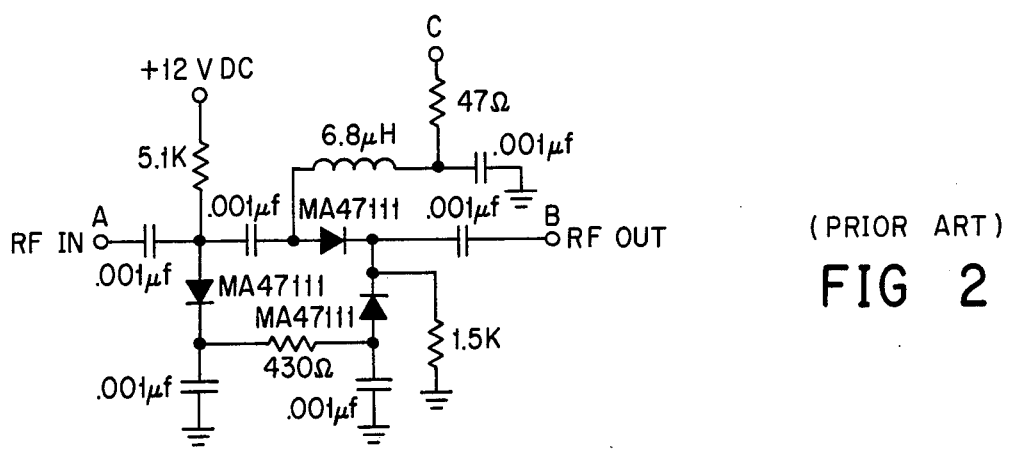
FIG. 2 is a schematic diagram showing a prior art PIN diode attenuator.

By way of example, the attenuator 12 may be any of a variety of conventional PI or TEE attenuators or any other impedance control device capable of altering the magnitude of an RF input signal for maintaining a relatively constant RF output signal. One example of such a conventional attenuator is shown in FIG. 2 which depicts a matched PI attenuator for use in an AGC controlled IF amplifer. The construction of the circuit is as specifically shown in FIG. 2 and includes exemplary values of voltage and components as may be employed to produce attenuation in a 50–90 MHz frequency range with an attenuation ranging from approximately 1 to 20 dB. In this circuit, the RF input is coupled to terminal A which corresponds to terminal A in FIG. 1 and the RF output is provided at terminal B which corresponds to terminal B in FIG. 1. Terminal C is the attenuator control line which controls attenuator 12 to either increase or decrease the attenuation in response to the control signal at C.

Figure 3:
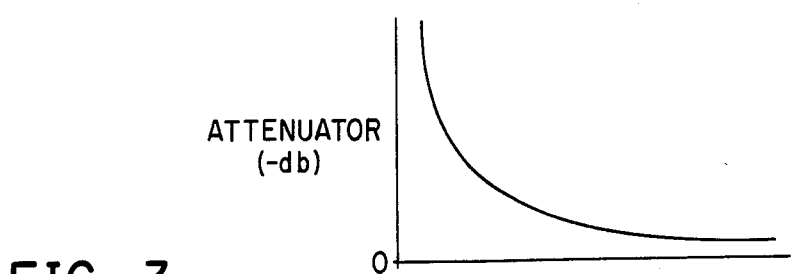
FIG. 3 is a schematic diagram showing a typical non-linear relationship between the attenuation and control signal of a prior art PIN diode attenuator.

In the specific embodiment shown in FIG. 2, a control voltage of approximately 20 volts DC will produce about 1 dB in attenuation at output B while a control voltage of approximately 3 volts DC will produce about 20 dB of attenuation at output B. The value of the control voltage necessary to attain particular attenuation between those limits is non-linear and may, for example, have a graphic configuration similar to that shown in FIG. 3 wherein the abscissa of the graph represents the magnitude of attenuation and the ordinate represents the magnitude of the control signal (voltage or current). As can be seen, a high magnitude of signal attenuation is attained with a relatively low magnitude control signal while a low magnitude attenuation is achieved with a relatively high magnitude control signal.

Referring again to FIG. 1, the RF output from attenuator 12 is sensed by a detector circuit 16 which may include a conventional diode detector including diode 18 having its anode coupled to the RF output and to shunt inductor 17, its cathode coupled to one end of series inductor 20 and shunt capacitor 22 coupled from the other end of inductor 20 to ground. The output of the detector 16 is taken at a junction between inductor 20 and capacitor 22 and coupled to provide a DC voltage (proportional to the RF output at 14) as an input to an integrator 24. The signal from the detector 16 is provided to integrator 24 through resistor R1 which is coupled to the negative input terminal of a conventional operational amplifier 26. A capacitor C1 is coupled between the negative terminal of operational amplifier 26 and the output terminal of that operational amplifier. The output of the operational amplifier 26 is in turn coupled to terminal C of attenuator 12 to provide the control signal and thus control the attenuation of the RF signal between terminals 10 and 14. The integrator 24 also includes a voltage reference Vdc coupled through resistor R2 and potentiometer R3 to ground. A wiper arm 28 of potentiometer R3 is coupled to one end of capacitor C2 which has its other end coupled to ground. The wiper arm 28 is also coupled to the positive terminal of operational amplifier 26. The arm 28 is used to vary the voltage input to the positive terminal of operational amplifier 26.

In operation, by adjustment of the reference voltage and values of R1 and C1 in a conventional manner, the control voltage out of the operational amplifier 26, which acts as the feedback control signal for attenuator 12 at terminal C, may be fixed to respond to the detected input voltage from detector 16 so that the feedback loop is stable over the range of attenuator operation. However, in order to achieve that stability, the loop gain must be reduced to a point where the loop will respond very slowly in the low attenuation region. This results in undesirable operation and slow response in that low attenuation region. If, as previously described, the gain of the loop is modified by adjustment of R1 and C1 so that the loop has a faster response in the low attenuation region, the output from terminal B in the high attenuation region will cause the loop gain to be increased to the point where the loop becomes unstable. Accordingly, as previously described, the prior art circuit of FIG. 1 suffers from an inability to maintain a high response in both the high and low attenuation regions due to the inability to increase loop gain in the low attenuation region without causing loop instability in the high attenuation region. This deficiency is caused by the non-linear relationship between the magnitude of the feedback control signal at terminal C and the magnitude of attenuation caused by that control signal.

In accordance with prior art techniques, a typical solution to the above problem has been to include a linearizing circuit between the detector 16 and attenuator control terminal C. Such linearizing circuits are well known in the art and accordingly will not be further described in detail herein, it being sufficient to note that they generally include a plurality of operational amplifiers and other circuit elements needed to produce a feedback signal at terminal C which is linearly related to the magnitude of attenuation produced by attenuator 12. In this manner, the loop gain may be fixed at the highest level possible over all ranges of attenuation and still maintain loop response speed and stability over all of those ranges. The disadvantages, however, are as noted previously and include primarily more expense, increased size, increased parts count, higher repair rate, and increased power. Such characteristics prevent reductions in size, weight, power requirements and expense of current technology devices.

Figure 4:
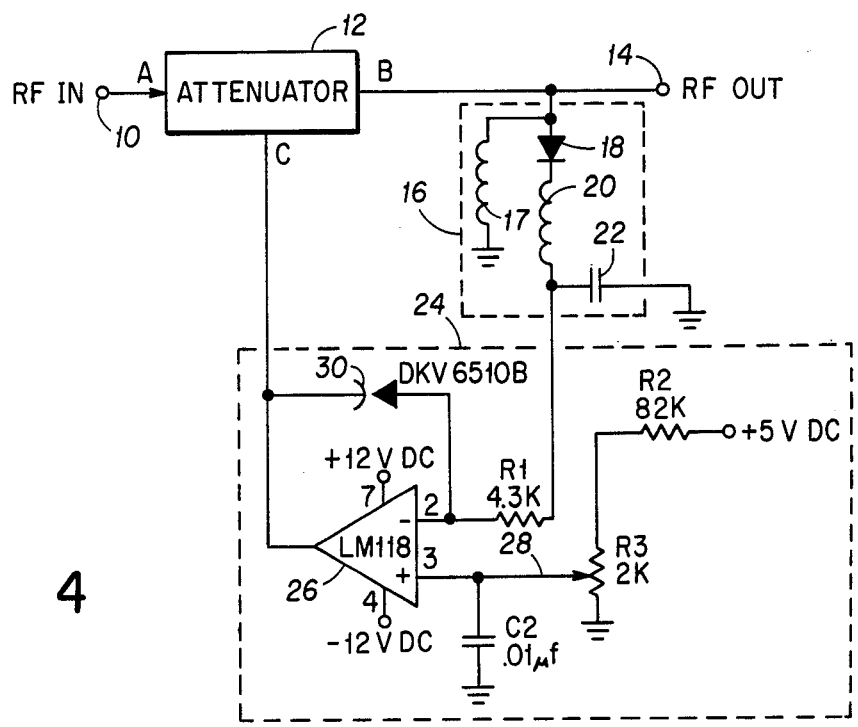
FIG. 4 is a schematic diagram showing the automatic gain control circuit in accordance with the present invention.

In accordance with the present invention, the use of a linearizer circuit in an automatic gain control circuit has been eliminated resulting in a circuit having fewer components, a lower repair rate, a lower power drain, smaller size and less weight. The improved AGC circuit is shown in FIG. 4 wherein like numerals are used to refer to like elements throughout. Thus, the RF input signal is coupled to terminal 10 as input A to attenuator 12 having its output B coupled to a terminal 14 for providing the RF output signal to an IF amplifier (not shown) or other appropriate device. A detector 16, including shunt inductor 17, diode 18, series inductor 20 and shunt capacitor 22, are coupled to provide a DC signal proportional to the RF output at 14 as input to integrator circuit 24. In this instance, the output from diode detector 16 is provided through resistor R1 again as the negative input to the operational amplifer 26 having its output coupled to terminal C of the attenuator 12. Integrator 24 again includes a reference voltage source Vdc coupled through resistor R2 and potentiometer R3 to ground and a wiper arm 28 coupled to capacitor C2 and to the positive terminal of operational amplifier 26.

As is apparent, the above construction of the circuit of FIG. 4 is identical to the circuit of FIG. 1. However, in accordance with the present invention, a varactor diode 30 is substituted for the capacitor C1 in the prior art circuit of FIG. 1. The varactor diode may be any of a variety of well-known devices such as a DKV 6510B made by Alpha Industries, Inc. The insertion of the varactor diode 30 in lieu of the capacitor C1 operates to increase feedback loop gain by decreasing capacitance as the loop gain tends to decrease in response to the RF signal input 10 (as sensed at the output 14) in a low attenuation region. Conversely, as the feedback loop gain tends to increase in response to the RF input signal at 10 (as sensed at the output 14) in a high attenuation region, the capacitance of the varactor diode increases reducing loop gain and stabilizing the feedback loop. This operation improves the AGC circuit response in the low attenuation region and stabilizes the feedback loop without the necessity for complex linearizer circuits, thus providing improved operation over the operable range of the attenuator.

Figure 5A:
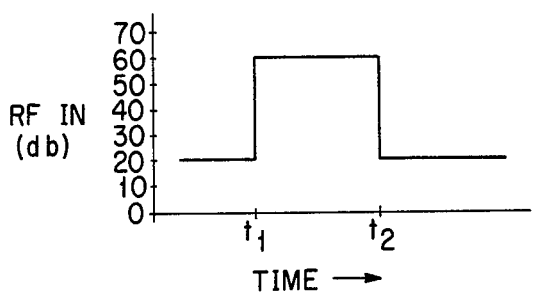
FIGS. 5a–5d is a schematic diagram showing an exemplary power pulse and automatic gain control circuit response for the prior art and inventive systems.

Specifically, it has been found that for a circuit having the specific component values shown in FIG. 4 and having an input from detector 16 varying from zero to 500 mV, and an output from operational amplifier 26 varying from zero to 12 volts DC (VDC), the response time for a 10 microsecond squarewave power pulse (increasing from 20 to 60 dB) as shown in FIG. 5a was less than half that of the conventional circuit of FIG. 1. Likewise, with the same circuit of FIG. 4, the feedback loop exhibited an increase in stability over that of the prior art circuit of FIG. 1. By changing the value of R1, the response time and stability may be varied to reflect that desired in a particular embodiment, but the circuit itself, regardless of the selection of the value of K within the desired limits of operation, will improve AGC operation.

Figure 5B:
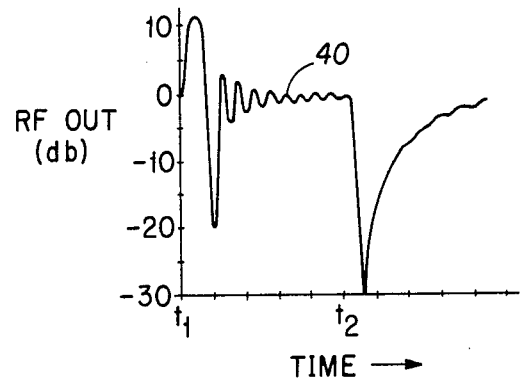
Figure 5C:
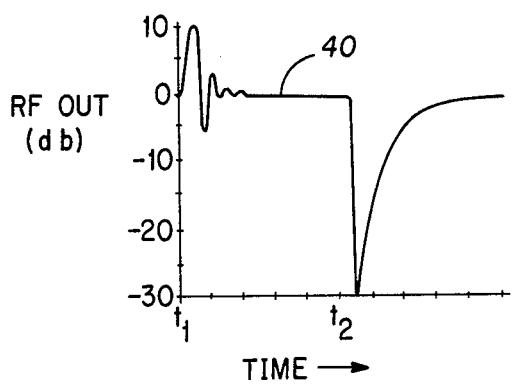
Figure 5D:
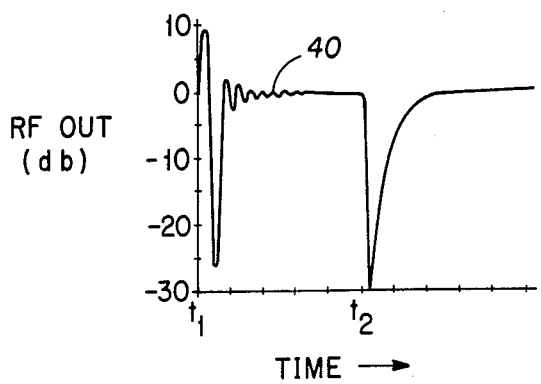

By way of example, when the circuit of FIG. 1 was constructed with the component values as illustrated in FIG. 4 and a value for C1 of 18 pf, the RF output signal response appeared as that shown in FIG. 5b for the power pulse of FIG. 5a. In FIG. 5b and 5c and 5d, the waveforms representing the output RF signal at 14 is shown as line 40 and defined along the ordinate in units of decibels with each division representing 5 dB from a 0 dB reference level. The abscissa represents elapsed time with the denoted times $t_1$ and $t_2$ corresponding to those same times in FIG. 5a and each division representing 2 μseconds. As can be seen in FIG. 5b, for the prior art circuit, the waveform 40 starting at time $t_1$, takes about 8 μseconds to substantially stabilize (to within ±1 dB of 0 dB reference level)in the high attenuation region. When the power is decreased at time $t_2$, the waveform takes about 10 μseconds to respond (to within ±1 dB of 0 dB reference level) and even then has not completely responded to adjust the attenuation for decreased RF inputs (low attenuation range).

Referring now to FIG. 5c, there is shown the RF output waveform using the circuit shown in FIG. 4 wherein the resistance R1 is chosen to be 4.3K. As will be apparent, starting a time $t_1$ (beginning of the power pulse at the RF input) the waveform 40 is damped and stabilized quickly in less than one-half the time of that for the example of FIG. 5b. Likewise, after time $t_2$, when the power pulse is removed, the waveform 40 responds in about 6 μseconds to adjust to the proper attenuation level (within ±1 dB of 0 dB reference level), much faster than that shown in FIG. 5b.

Alternatively, when the value of R1 in FIG. 4 is decreased to 680 ohms, the response of the attenuator as reflected by the RF output at 14 is shown in FIG. 5d. In this instance, upon the introduction of the power pulse at $t_1$, the waveform 40 damps and stabilizes in about 4 μs (compared to 3 μs in FIG. 5c) in the high attenuation range, and after time $t_2$ responds in about 4 μs (compared to 6 μs in FIG. 5c) at the low attenuation range. By adjusting the value of R1, the response time in the low attenuation region may be increased at the expense of response and stability in the high attenuation region and vice-versa. However, regardless of the value of R1, the response time in the high and low attenuation regions was significantly improved along with feedback loop stability over that of prior art circuits.

As will be understood from the above description, the present invention provides an AGC circuit which has improved loop stability and increased response times. In particular, in automatic gain control circuits using attenuators having a non-linear relation between the control signal and the magnitude of the attenuation produced by the control signal, the present circuit acts to increase loop gain in low attenuation regions to improve response time and decrease loop gain in high attenuation regions to render the loop more stable. This compensates for signal inputs to the loop in the high and low attenuation regions which would normally drive the loop to instability and reduce response time to unacceptable levels. The circuit accomplishes such improved control with only a simple modification to a conventional circuit with inexpensive and conventional components. Use of the improved circuit eliminates the need for expensive linearizer circuits and accordingly reduces the complexity, size, and power requirements of such circuits. Electronic devices may therefore be constructed with automatic gain control circuits of less cost and reduced size and still provide good loop response over wide ranges of operation. All of these are features which are not taught or shown in the prior art.

Although the invention has been described with specific reference to a matched P1 attenuator using PIN diodes, it is apparent that the circuit may be employed with any attenuator having a non-linear attenuator versus control signal characteristic, such as bridged TEE attenuators, or any other control element having a non-linear relationship between signal output and the control signal which varies the magnitude of that output. Likewise, although specific component values and voltage levels have been shown in the diagrams for the described embodiment, it is apparent that other values may be chosen in accordance with the particular environment in which the control circuit is used.

Obviously, many other modifications and variations of the present invention are possible in light of the above teachings. It is therefore to be understood that within the scope of the appended claims, the invention may be practiced otherwise than as specifically described.

What is claimed is:

1. An apparatus for use in an automatic gain control circuit comprising:
    an operational amplifier having first and second input terminals and an output terminal; and
    a varactor diode electrically coupled between said output terminal and one of said input terminals.

2. The apparatus of claim 1 wherein said first input terminal is a negative input terminal and said second input terminal is a positive input terminal and said varactor diode is electrically coupled betwen the output of said operational amplifier and said negative input terminal.

3. In an electrical apparatus having an operational amplifier constructed to have positive and negative input terminals and an output terminal, a reference voltage coupled to the positive input terminal and a control signal coupled to the negative terminal, the improvement in said electrical apparatus comprising:
    a varactor diode electrically coupled between the output of said operational amplifier and the negative input terminal.

4. An automatic gain control circuit comprising:
    means for receiving an input signal and responsive to a control signal for controlling the magnitude of that input signal to provide an output signal;
    means comprising a diode detector for detecting said output signal and coupled to provide a DC voltage proportional to the output signal as a detected signal; and
    means responsive to said detected signal for providing a feedback control signal to said means for receiving to produce a feedback loop which increases in gain in response to a first level of signal output from said means for receiving and decreases in gain in response to a second level of signal output from said means for receiving to maintain said output at a relatively constant magnitude and which comprises an operational amplifier having a negative input and a positive input and an output coupled to provide said feedback control signal, a DC reference voltage coupled to the positive input of said operational amplifier, and a varactor diode coupled between the negative input and the output of said operational amplifier, said detector being coupled to provide said detected signal to said negative input of said operational amplifier.

5. The circuit of claim 4 further comprising a varying signal source coupled to provide said input signal to said means for receiving.

6. An automatic gain control circuit for controlling RF signal levels comprising:
    means for providing an RF signal input;
    an attenuator having an input coupled to receive said RF input, a control terminal coupled to control the signal level of said RF input in response to a feedback control signal for providing a controlled RF signal output, said attenuator having a non-linear relation between the magnitude of said feedback control signal and the magnitude of the controlled signal output produced by that feedback control signal;
    means for sensing said controlled RF signal output and providing a signal proportional to that output; and
    means responsive to said proportional signal for providing a feedback control signal for maintaining said controlled output at a relatively constant magnitude, said means for providing said feedback control signal being constructed and arranged with said means for sensing to form a feedback loop which increases loop gain in response to a proportional signal decreasing loop gain and which decreases loop gain in response to a proportional signal which increases loop gain.

7. The apparatus of claim 6 wherein said means for providing a feedback control signal is an operational amplifier having first and second inputs, said first input being coupled to receive said proportional signal, said second input being coupled to receive a reference voltage signal and a varactor diode being coupled between the output and one of said inputs of said operational amplifier.

8. The circuit of claim 7 wherein said first and second inputs are a negative and positive input, respectively, said positive input being coupled to said reference voltage, said negative input being coupled to receive said proportional signal and said varactor diode being coupled between said output and said negative input.

9. In an automatic gain control circuit having an RF attenuator which receives a varying RF input signal and provides a relatively constant RF output signal in response to a feedback control signal and a feedback circuit including means for sensing said RF output signal and producing a feedback control signal for maintaining said relatively constant RF output signal, wherein said attenuator produces a magnitude of attenuation which is not linearly related to the magnitude of the feedback control signal controlling that attenuation, the improvement in said feedback circuit comprising:
    an operational amplifier having an input coupled to receive a signal proportional to the RF output signal and an output for providing said feedback control signal ; and
    a varactor diode coupled between the output and input of said operational amplifier.

10. The circuit of claim 9 wherein said operational amplifier has a positive input and a negative input with said negative input coupled to receive said proportional signal, said positive input coupled to receive a reference voltage and said varactor diode coupled between the output and the negative input of said operational amplifier.

11. The circuit of claim 10 further comprising a variable impedance coupled between said proportional signal and said negative input for varying the response time of said feedback circuit.

* * * * *